United States Patent
Hong

(10) Patent No.: US 11,476,844 B1
(45) Date of Patent: Oct. 18, 2022

(54) METHOD OF STABILIZING DATA OF DIGITAL SIGNALS

(71) Applicant: ANPEC ELECTRONICS CORPORATION, Hsinchu (TW)

(72) Inventor: Jia-Hua Hong, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/549,872

(22) Filed: Dec. 14, 2021

(30) Foreign Application Priority Data

Sep. 27, 2021 (TW) .................................. 110135731

(51) Int. Cl.
    *H03K 5/00* (2006.01)
    *H03K 5/1252* (2006.01)
    *H03K 3/013* (2006.01)

(52) U.S. Cl.
    CPC ........... *H03K 5/1252* (2013.01); *H03K 3/013* (2013.01)

(58) Field of Classification Search
None
See application file for complete search history.

(56) References Cited

U.S. PATENT DOCUMENTS

| | | | |
|---|---|---|---|
| 9,418,414 B2 * | 8/2016 | Motomura | G06T 11/001 |
| 2009/0141975 A1 * | 6/2009 | Li | H04N 9/735 382/167 |

* cited by examiner

*Primary Examiner* — Tuan T Lam
(74) *Attorney, Agent, or Firm* — Li & Cai Intellectual Property Office

(57) ABSTRACT

A method of stabilizing data of digital signals is provided. The method includes steps of: (a) determining whether or not next input data is larger than previous output data, if yes, adding a base value to a trend value and then performing step(c), if no, performing step(b); (b) determining whether or not the next input data is smaller than the previous output data, if yes, subtracting the base value from the trend value and performing step(c), if no, performing step(c); (c) determining whether or not the trend value is larger than a positive threshold, if yes, subtracting a trend correction coefficient from the previous output data, if no, performing step(d); and (d) determining whether or not the trend value is smaller than a negative threshold, if yes, adding the trend correction coefficient to the previous output data; if no, outputting the previous output data.

10 Claims, 8 Drawing Sheets

| Time Point | T1 | T2 | T3 | T4 | T5 | T6 | T7 | T8 | T9 | T10 | T11 | T12 | T13 | T14 | T15 | How Many Kinds Of Values |
|---|---|---|---|---|---|---|---|---|---|---|---|---|---|---|---|---|
| Read Value | +0 | +1 | +2 | +1 | -3 | -2 | +1 | -2 | -2 | -1 | -1 | -2 | -1 | -1 | -2 | 5 |
| Output Value | +0 | +0 | +0 | +0 | -1 | -1 | -1 | -1 | -1 | -1 | -1 | -1 | -1 | -1 | -1 | 1 |

| Time Point | T1 | T2 | T3 | T4 | T5 | T6 | T7 | T8 | T9 | T10 | T11 | T12 | T13 | T14 | T15 | How Many Kinds Of Values |
|---|---|---|---|---|---|---|---|---|---|---|---|---|---|---|---|---|
| Read Value | +0 | +1 | +2 | +1 | -3 | -2 | +1 | -2 | -2 | -1 | -1 | -2 | -1 | -1 | -2 | 5 |
| Output Value | +0 | +0 | +0 | +0 | -1 | -1 | -1 | -1 | -1 | -2 | -2 | -2 | -2 | -2 | -2 | 2 |

METHOD OF STABILIZING DATA OF DIGITAL SIGNALS

CROSS-REFERENCE TO RELATED PATENT APPLICATION

This application claims the benefit of priority to Taiwan Patent Application No. 110135731, filed on Sep. 27, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to digital signals, and more particularly to a method of stabilizing data of digital signals.

BACKGROUND OF THE DISCLOSURE

When an ambient light is weak, an intensity of a light signal sensed by a sensor such as an ambient light sensor (ALS) or a proximity sensor (PS) slightly fluctuates over time. When a user reads continuous fluctuation in the light intensity displayed on the sensor, the user may mistakenly think that the continuous fluctuation is caused by noise and the sensor cannot effectively filter the noise.

SUMMARY OF THE DISCLOSURE

In response to the above-referenced technical inadequacies, the present disclosure provides a method of stabilizing data of digital signals. The method includes the following steps: (a) setting a positive boundary range coefficient, a negative boundary range coefficient, a stage correction coefficient and a trend correction coefficient; (b) reading a piece of digital input data; (c) outputting a value of the piece of digital input data as an output value of the piece of digital input data; (d) reading a next piece of digital input data; (e) subtracting the output value of the piece of digital input data being previously read from a value of the next piece of digital input data being currently read to calculate a difference; (f) determining whether or not the difference is larger than the positive boundary range coefficient, in response to determining that the difference is larger than the positive boundary range coefficient, subtracting the stage correction coefficient from the value of the next piece of digital input data to output an output value of the next piece of digital input data, defining a trend value to be a zero value and then performing step (j), and in response to determining that the difference is not larger than the positive boundary range coefficient, performing step (g); (g) determining whether or not the difference is smaller than the negative boundary range coefficient, in response to determining that the difference is smaller than the negative boundary range coefficient, summing up the value of the next piece of digital input data and the stage correction coefficient to output the output value of the next piece of digital input data, defining the trend value to be the zero value, performing step (j), and in response to determining that the difference is not smaller than the negative boundary range coefficient, performing step (h); (h) determining whether or not the value of the next piece of digital input data is larger than the output value of the piece of digital input data being previously read, in response to determining that the value of the next piece of digital input data is larger than the output value of the piece of digital input data being previously read, adding a base value to the trend value and then performing step (j), and in response to determining that the value of the next piece of digital input data is not larger than the output value of the piece of digital input data being previously read, performing step (i); (i) determining whether or not the value of the next piece of digital input data is smaller than the output value of the piece of digital input data being previously read, in response to determining that the next piece of digital input data is smaller than the output value of the piece of digital input data being previously read, subtracting the base value from the trend value and performing step (j), and in response to determining that the next piece of digital input data is not smaller than the output value of the piece of digital input data being previously read, performing step (j); (j) determining whether or not the trend value is larger than a positive trend threshold, in response to determining that the trend value is larger than the positive trend threshold, subtracting the trend correction coefficient from the output value of the piece of digital input data being previously read to output the output value of the next piece of digital input data, performing step (d) to read a further next piece of digital input data, and in response to determining that the trend value is not larger than the positive trend threshold, performing step (k); (k) determining whether or not the trend value is smaller than a negative trend threshold, in response to determining that the trend value is smaller than the negative trend threshold, summing up the output value of the piece of digital input data being previously read and the trend correction coefficient to output the output value of the next piece of digital input data, performing step (d) to read the further next piece of digital input data, and in response to determining that the trend value is not smaller than the negative trend threshold, performing step (l); and (l) outputting a value that is equal to the output value of the piece of digital input data being previously read as the output value of the next piece of digital input data, and then performing step (d) to read the further next piece of digital input data.

In certain embodiments, the method further includes the following step: (m) defining a value of the piece of digital data that is earliest read as a center value.

In certain embodiments, the method further includes the following steps: (n) determining whether or not the difference is larger than the positive boundary range coefficient, in response to determining that the difference is larger than the positive boundary range coefficient, subtracting the stage correction coefficient from the value of the next piece of digital input data to calculate a first center value, updating the center value to be equal to the first center value, outputting a value that is equal to the first center value as the output value of the next piece of digital input data and then performing step (j), and in response to determining that the difference is not larger than the positive boundary range coefficient, performing step (o); and (o) determining whether or not the difference is smaller than the negative boundary range coefficient, in response to determining that the difference is smaller than the negative boundary range coefficient, summing up the value of the next piece of digital input data and the stage correction coefficient to calculate a second center value, updating the center value to be equal to the second center value, outputting a value that is equal to the second center value as the output value of the next piece of digital input data and then performing step (j), and in response to determining that the difference is not smaller than the negative boundary range coefficient, performing step (h).

In certain embodiments, the method further includes the following steps: (p) calculating a change in an amplitude of the center value; and (q) according to the change in the amplitude of the center value, dynamically adjusting one or more of the positive boundary range coefficient, the negative boundary range coefficient, the stage correction coefficient and the trend correction coefficient.

In certain embodiments, the method further includes the following step: (r) setting the positive boundary range coefficient to be equal to an absolute value of the negative boundary range coefficient.

In certain embodiments, the method further includes the following step: (s) setting the trend correction coefficient to be smaller than one or more of the positive boundary range coefficient, the absolute value of the negative boundary range coefficient and the stage correction coefficient.

In certain embodiments, the method further includes the following step: (t) setting the trend correction coefficient such that a ratio of the trend correction coefficient to the positive boundary range coefficient or the negative boundary range coefficient is equal to a preset trend boundary ratio.

In certain embodiments, the method further includes the following step: (u) setting the trend correction coefficient such that a ratio of the trend correction coefficient to the stage correction coefficient is equal to a preset trend stage ratio.

In certain embodiments, the method further includes the following step: (v) setting the trend value to be the zero value before adding the base value to the trend value or subtracting the base value from the trend value.

In certain embodiments, the method further includes the following step: (w) according to a value of each of multiple pieces of digital input data, automatically adjusting the base value such that a ratio of the value of each of the multiple pieces of digital input data to the base value is equal to a preset ratio.

As described above, the present disclosure provides the method of stabilizing the data of the digital signals, which has the following characteristics:
1. an algorithm is executed on the digital signals to correct the digital signals according to the preset positive boundary range coefficient, the preset negative boundary range coefficient, the preset stage correction coefficient and the preset trend correction coefficient, thereby reducing noise of the digital signals and improving stability of the output values of the digital signals;
2. the positive boundary range coefficient, the negative boundary range coefficient, the stage correction coefficient and the trend correction coefficient can be manually set according to user's needs or automatically set and adjusted (for example, according to a change in an amplitude of the input value or the output value);
3. the value of the next piece of digital input data can be compared with the output value of the previous piece of digital input data in real time, which only takes a small amount of time, and only a small part of a space of a register is occupied by these digital input data;
4. a digital filter, an averager or other digital processors can be used to perform operations on the digital signals, and
5. the method of the present disclosure can be performed by a digital hardware circuit or a software.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
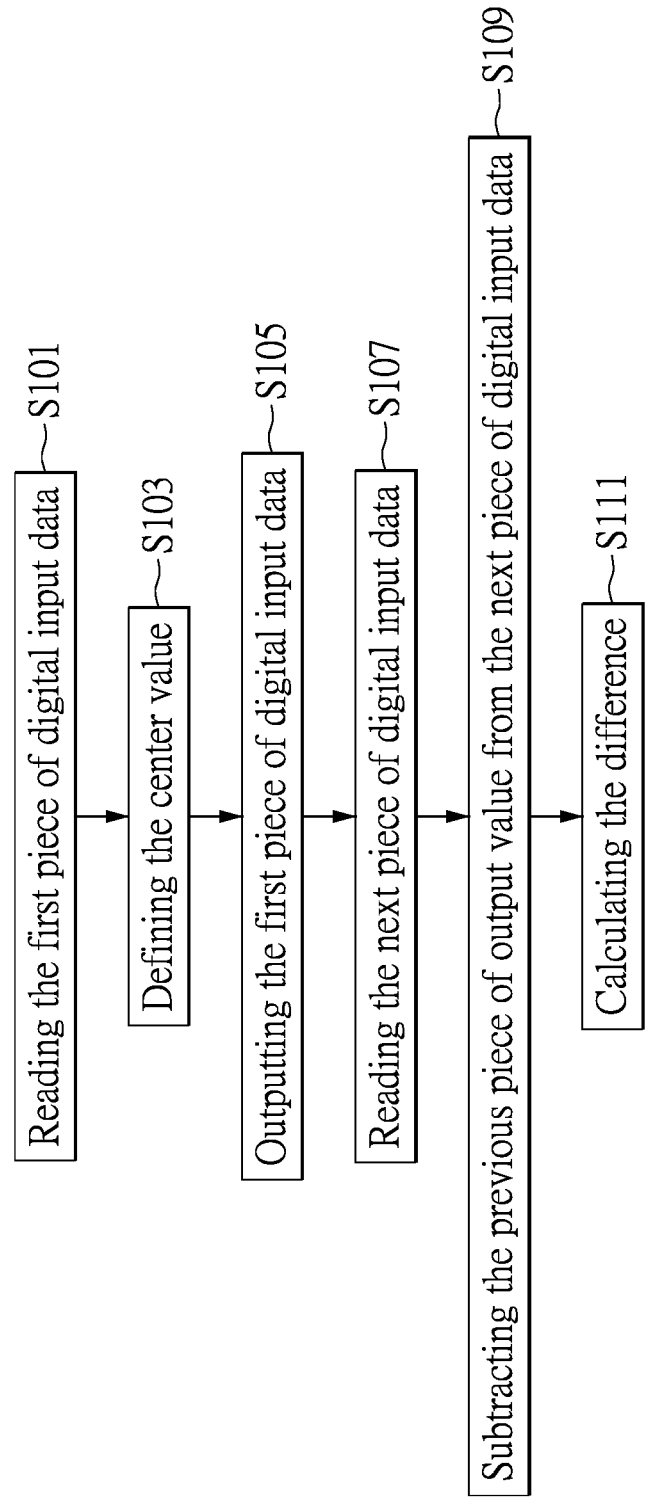
FIG. 1 is a first flowchart diagram of steps of a method of stabilizing data of digital signals according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 6:
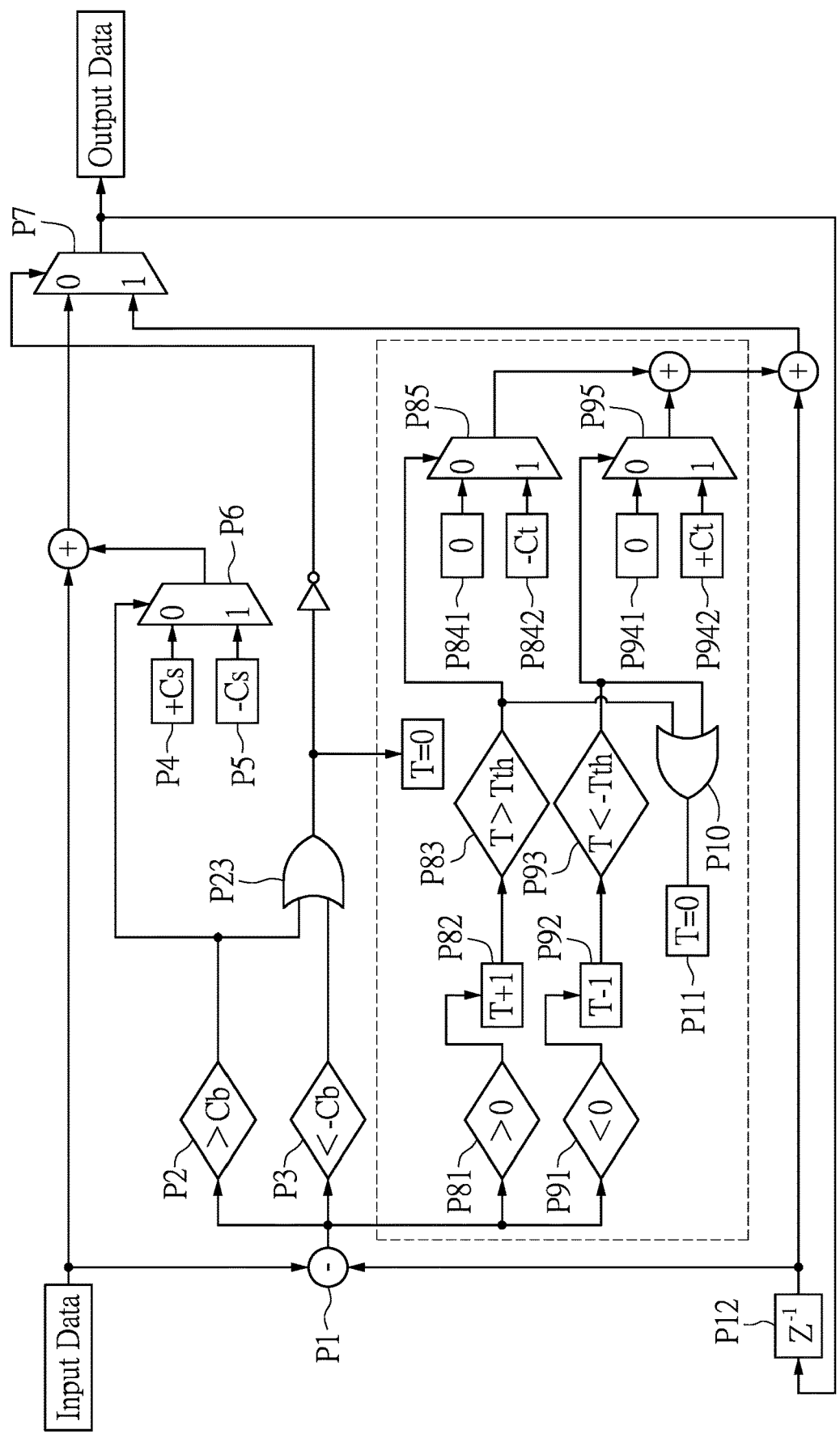
FIG. 6 is a schematic diagram of a computing architecture of the method of stabilizing the data of the digital signals according to the embodiment of the present disclosure.

Reference is made to FIGS. 1 and 6, in which FIG. 1 is a first flowchart diagram of steps of a method according to an embodiment of the present disclosure, and FIG. 6 is a schematic diagram of a computing architecture of the method of stabilizing the data of the digital signals according to the embodiment of the present disclosure.

As shown in FIG. 1, in the embodiment of the present disclosure, the method of stabilizing the data of the digital signals may include steps S101 to S111 that are applicable to the computing architecture as shown in FIG. 6. It should be understood that, an order and contents of the steps of the method described herein may be adjusted or omitted according to actual requirements.

In step S101, a first piece of digital input data is read.

In step S103, a center value is defined. The defined center value is equal to a value of the first piece of digital input data.

In step S105, the value of the first piece of digital input data is outputted. That is, the value that is equal to the center value is outputted.

In step S107, a next piece of digital input data is read.

In step S109, an output value of a previous piece of digital input data is subtracted from a value of the next piece of digital input data being currently read, to calculate a difference in step S111. It should be understood that, if the next piece of digital input data is a second piece of digital input data, the previous piece of digital input data is the first piece of digital input data as described in step S101.

As shown in FIG. 6, in a stage P12, the output value of the previous piece of digital input data is obtained. Then, in a stage P1, the output value of the previous piece of digital input data is subtracted from the value of the next piece of digital input data (by a subtractor).

Figure 2:
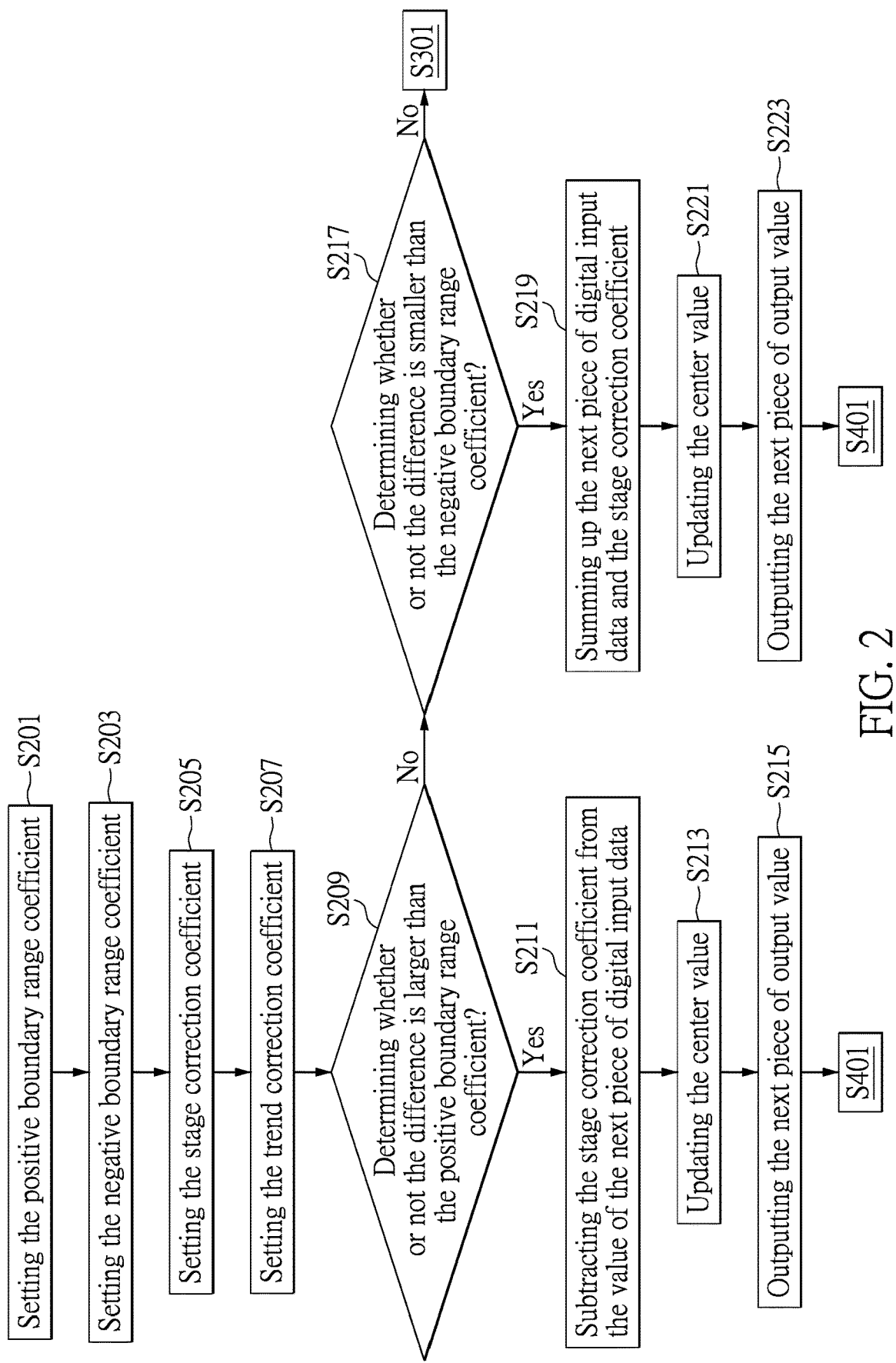
FIG. 2 is a second flowchart diagram of steps of the method of stabilizing the data of the digital signals according to the embodiment of the present disclosure.

Reference is made to FIGS. 2 and 6, in which FIG. 2 is a second flowchart diagram of steps of the method of stabilizing the data of the digital signals according to the embodiment of the present disclosure, and FIG. 6 is a schematic diagram of a computing architecture of the method of stabilizing the data of the digital signals according to the embodiment of the present disclosure.

As shown in FIG. 2, in the embodiment of the present disclosure, the method of stabilizing the data of the digital signals may include steps S201 to S223 that are applicable to the computing architecture as shown in FIG. 6.

In step S201, a positive boundary range coefficient is set.

In step S203, a negative boundary range coefficient is set. For example, a value of the negative boundary range coefficient may be set to be equal to a value of the positive boundary range coefficient. That is, the positive boundary range coefficient may be set to be equal to an absolute value of the negative boundary range coefficient.

In step S205, a stage correction coefficient is set.

In step S207, a trend correction coefficient is set.

In addition, a trend value may be initially set to a zero value. The trend correction coefficient may be set such that a ratio of the trend correction coefficient to the stage correction coefficient is equal to a preset trend stage ratio. For example, the trend correction coefficient may be set to half the stage correction coefficient. In addition, the trend correction coefficient may be set such that a ratio of the trend correction coefficient to the positive boundary range coefficient or the negative boundary range coefficient is equal to a preset trend boundary ratio. For example, the trend correction coefficient may be set to half the positive boundary range coefficient.

In step S209, it is determined whether or not the difference calculated in step S109 is larger than the positive boundary range coefficient. As shown in FIG. 6, in a stage P2, it is determined whether or not the difference between the output value of the previous piece of digital input data and the value of the next piece of digital input data is larger than a positive boundary range coefficient Cb. Steps S211 to S215 are sequentially performed and then step S401 is performed if the difference calculated in step S109 is larger than the positive boundary range coefficient as represented by the following equation:

$$Din(n)-Dout(n-1)>Cb(n-1),$$

wherein Din(n) represents an input value of an nth piece of digital input data, n may be any suitable integer, Dout(n−1) represents an output value of a (n−1)th piece of digital input data, and Cb(n−1) represents the positive boundary range coefficient of the (n−1)th piece of digital input data.

Conversely, if the difference calculated in step S109 is not larger than the positive boundary range coefficient, step S217 is performed.

In step S211, the stage correction coefficient is subtracted from the value of the next piece of digital input data to output an output value of the next piece of digital input data, which is represented by the following equation:

$$Dout(n)=Din(n)-Cs(n-1),$$

wherein Dout(n) represents an output value of the nth piece of digital input data that is the output value of the next piece of digital input data as described above, n may be any suitable integer, Din(n) represents the input value of the nth piece of digital input data, and Cs(n−1) represents the stage correction coefficient of the (n−1)th piece of digital input data.

As shown in FIG. 6, if it is determined that the difference between the output value of the previous piece of digital input data and the value of the next piece of digital input data is larger than the positive boundary range coefficient Cb in the stage P2, a data multiplexer in a stage P6 selects a stage P4. Then, a positive stage adjusting coefficient Cs in the stage P4 is subtracted from the value of the next piece of digital input data. Alternatively, the data multiplexer in the stage P6 selects a stage P5, the value of the next piece of digital input data and a negative stage adjusting coefficient −Cs in the stage P5 are summed up.

In step S213, the center value is updated to be equal to the output value of the next piece of digital input data that is calculated in step S211.

In step S215, the value calculated in step S211 is outputted as the output value of the next piece of digital input data. That is, the center value updated in step S213 is outputted. At this time, the trend value is defined to be equal to the zero value.

In step S217, it is determined whether or not the difference calculated in step S109 is smaller than the negative boundary range coefficient as represented by the following equation:

$$Din(n)-Dout(n-1)<-Cb(n-1),$$

wherein Din(n) represents the input value of the nth piece of digital input data, n may be any suitable integer, Dout(n−1) represents the output value of the (n−1)th piece of digital input data, and −Cb(n−1) represents the negative boundary range coefficient of the (n−1)th piece of digital input data. As shown in FIG. 6, in a stage P3, it is determined whether or not the difference is smaller than a negative boundary range coefficient −Cb.

If the difference calculated in step S109 is not larger than the positive boundary range coefficient and is smaller than the negative boundary range coefficient, steps S219 to S223 are sequentially performed and then step S401 is performed.

Conversely, if the difference calculated in step S109 is not larger than the positive boundary range coefficient and is not smaller than the negative boundary range, it is determined that the output value of the previous piece of digital output value is equal to the value of the next piece of digital input data, and thus step S301 is performed.

In step S219, the value of the next piece of digital input data and the stage correction coefficient are summed up, which is represented by the following equation:

$$Dout(n)=Din(n)+Cs(n-1),$$

wherein Dout(n) represents the output value of the nth piece of digital input data that is the output value of the next piece of digital input data as described above, n may be any suitable integer, Din(n) represents the input value of the nth piece of digital input data, and Cs(n−1) represents the stage correction coefficient of the (n−1)th piece of digital input data.

As shown in FIG. 6, if the difference between the output value of the previous piece of digital input data and the value of the next piece of digital input data is not larger than the positive boundary range coefficient Cb in the stage P2, the data multiplexer in the stage P6 selects the stage P4. Then, the value of the next piece of digital input data and the positive stage correction coefficient Cs in the stage P4 are summed up.

In step S221, the center value is updated to be equal to the output value of the next piece of digital input data that is calculated in step S219.

In step S223, the value calculated in step S219 is outputted as the output value of the next piece of digital input data. That is, the center value updated in step S221 is outputted. At this time, the trend value is defined to be equal to the zero value.

Figure 3:
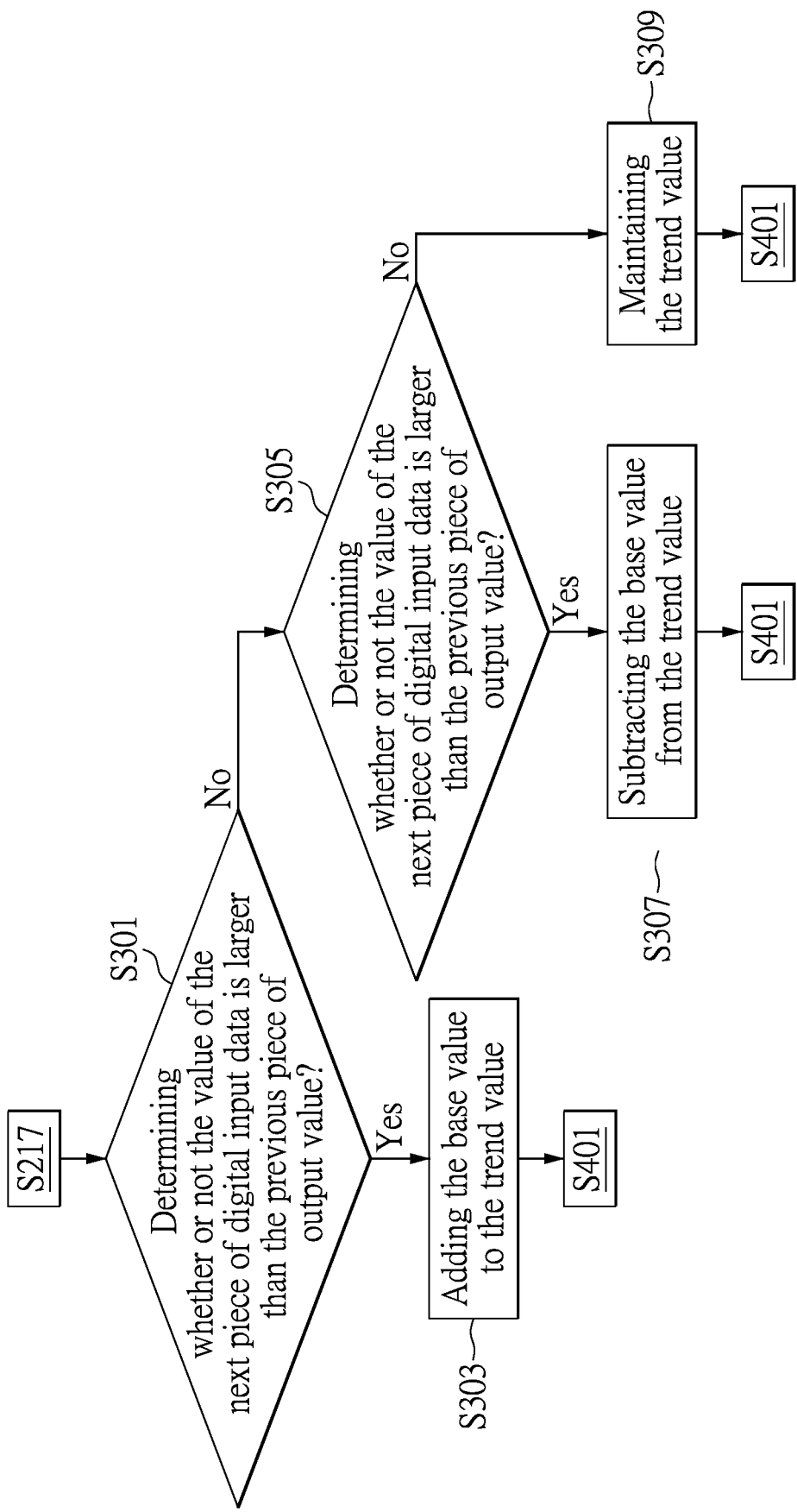
FIG. 3 is a third flowchart diagram of steps of the method of stabilizing the data of the digital signals according to the embodiment of the present disclosure.

Reference is made to FIGS. 3 and 6, in which FIG. 3 is a third flowchart diagram of steps of the method of stabilizing the data of the digital signals according to the embodiment of the present disclosure, and FIG. 6 is a schematic diagram of a computing architecture of the method of stabilizing the data of the digital signals according to the embodiment of the present disclosure.

As shown in FIG. 3, in the embodiment of the present disclosure, the method of stabilizing the data of the digital signals may include steps S301 to S309 that are applicable to the computing architecture as shown in FIG. 6.

In step S301, it is determined whether or not the value of the next piece of digital input data is larger than the output value of the previous piece of digital input data as represented by the following equation:

$$Din(n)>Dout(n-1),$$

wherein Din(n) represents the input value of the nth piece of digital input data, and Dout(n−1) represents the output value of the (n−1)th piece of digital input data.

If the value of the next piece of digital input data is larger than the output value of the previous piece of digital input data, steps S303 and S401 are performed. Conversely, if the value of the next piece of digital input data is not larger than the output value of the previous piece of digital input data, step S305 is performed.

In step S303, a base value is added to the trend value, which is represented by the following equation:

$$T(n)=T(n-1)+B,$$

wherein T(n) represents the trend value of the nth piece of digital input data, T(n−1) represents the trend value of the (n−1)th piece of digital input data, and B represents the base value.

The base value B may be "1", but the present disclosure is not limited thereto. In practice, the base value B may be set by a user or may be automatically set and adjusted according to the value of each of multiple pieces of digital input data such that a ratio of the value of each of the multiple pieces of digital input data to the base value is equal to a preset ratio. The preset ratio may be determined according to actual requirements.

As shown in FIG. 6, if it is determined that the difference between the output value of the previous piece of digital input data and the value of the next piece of digital input data is larger than the zero value, a stage P82 is performed. In the stage P82, the base value such as "1" is added to the trend value.

In step S305, it is determined whether or not the value of the next piece of digital input data is smaller than the output value of the previous piece of digital input data as represented by the following equation:

$$Din(n)<Dout(n-1),$$

wherein Din(n) represents the input value of the nth piece of digital input data, and Dout(n−1) represents the output value of the (n−1)th piece of digital input data.

If the value of the next piece of digital input data is smaller than the output value of the previous piece of digital input data, steps S307 and S401 are sequentially performed.

As shown in FIG. 6, if it is determined that the difference between the output value of the previous piece of digital input data and the value of the next piece of digital input data is smaller than the zero value in a stage P91, a stage P92 is performed. In the stage P92, the base value such as "1" is subtracted from the trend value.

Conversely, if the value of the next piece of digital input data is not smaller than and is not larger than the output value of the previous piece of digital input data, the value of the next piece of digital input data is equal to the output value of the previous piece of digital input data, and thus steps S309 and S401 are sequentially performed.

In step S307, the base value is subtracted from the trend value, which is represented by the following equation:

$$T(n)=T(n-1)-B,$$

wherein T(n) represents the trend value of the nth piece of digital input data, T(n−1) represents the trend value of the (n−1)th piece of digital input data, and B represents the base value.

In step S309, the base value is maintained. That is, the base value of the next piece of digital input data is equal to the base value of the previous piece of digital input data.

Figure 4:
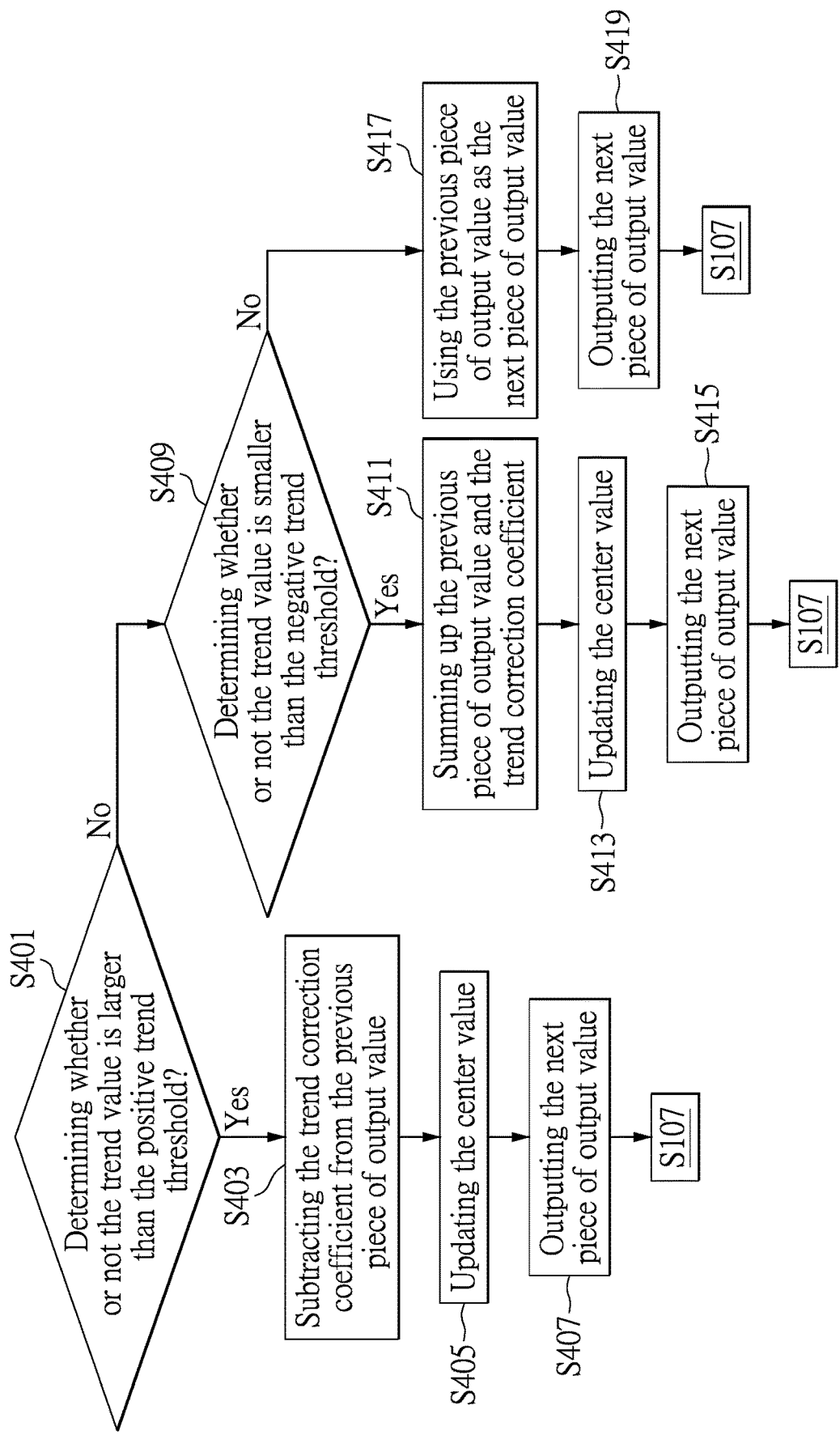
FIG. 4 is a fourth flowchart diagram of steps of the method of stabilizing the data of the digital signals according to the embodiment of the present disclosure.

Reference is made to FIGS. 4 and 6, in which FIG. 4 is a fourth flowchart diagram of steps of the method of stabilizing the data of the digital signals according to the embodiment of the present disclosure, and FIG. 6 is a schematic diagram of a computing architecture of the method of stabilizing the data of the digital signals according to the embodiment of the present disclosure.

As shown in FIG. 4, in the embodiment of the present disclosure, the method of stabilizing the data of the digital signals may include steps S401 to S419 that are applicable to the computing architecture as shown in FIG. 6.

In step S401, it is determined whether or not the trend value is larger than a positive trend threshold, which is represented by:

$$T(n)>Tth,$$

wherein T(n) represents the trend value of the nth piece of digital input data and Tth represents the positive trend threshold.

If the trend value is larger than the positive trend threshold, steps S403 to S407 are sequentially performed, and then a further next piece of digital input data is read in step S107. Conversely, if the trend value is not larger than the positive trend threshold, step S409 is performed.

In step S403, the trend correction coefficient is subtracted from the output value of the previous piece of digital input data to calculate a value that may be used as a first center value, which is represented by the following equation:

$$Dout(n)=Dout(n-1)-Ct,$$

wherein Dout(n) represents the output value of the nth piece of digital input data, Dout(n−1) represents the output value of the (n−1)th piece of digital input data, and Ct represents the trend correction coefficient.

As shown in FIG. 6, if it is determined that a trend value T is larger than a positive trend threshold Tth in a stage P83, a data multiplexer in a stage P85 selects a stage P842. In the stage P842, a positive trend correction coefficient Ct is subtracted from the output value of the previous piece of digital input data that is obtained in the stage P12, or the output value of the previous piece of digital input data and a negative trend correction coefficient −Ct are summed up.

In step S405, the center value is updated to be equal to the first center value calculated in step S403.

In step S407, a value that is equal to the value calculated in step S403 is outputted as the output value of the next piece of digital input data.

In step S409, it is determined that the trend value is smaller than a negative trend threshold, which is represented by:

$$T(n)<-Tth,$$

wherein T(n) represents the trend value of the nth piece of digital input data and −Tth represents the negative trend threshold.

If the trend value is smaller than the negative trend threshold, steps S411 to S415 are sequentially performed, and then the further next piece of digital input data is read in step S107. Conversely, if the trend value is not larger than the positive trend threshold and not smaller than the negative trend threshold, steps S417 to S421 are sequentially performed, and then the further next piece of digital input data is read in step S107.

In step S411, the trend correction coefficient and the output value of the previous piece of digital input data are summed up to calculate a value that may be used as a second center value, which is represented by the following equation:

$$Dout(n)=Dout(n-1)+Ct,$$

wherein Dout(n) represents the output value of the nth piece of digital input data, Dout(n−1) represents the output value of the (n−1)th piece of digital input data, and Ct represents the trend correction coefficient.

As shown in FIG. 6, if it is determined that the trend value T is smaller than the negative trend threshold Tth in a stage P93, a data multiplexer in a stage P95 selects a stage P942. In the stage P942, the output value of the previous piece of digital input data that is obtained in the stage P12 and the positive trend correction coefficient Ct are summed up.

In step S413, the center value is updated to be equal to the second center value calculated in step S411.

In step S415, a value that is equal to the value calculated in step S411 is outputted as the output value of the next piece of digital input data.

In step S417, a value that is equal to the output value of the previous piece of digital input data is used as the output value of the next piece of digital input data, which is represented by the following equation:

$$Dout(n)=Dout(n-1),$$

wherein Dout(n) represents the output value of the nth piece of digital input data and Dout(n−1) represents the output value of the (n−1)th piece of digital input data.

In step S419, the output value of the next piece of digital input data is outputted.

Figure 5:
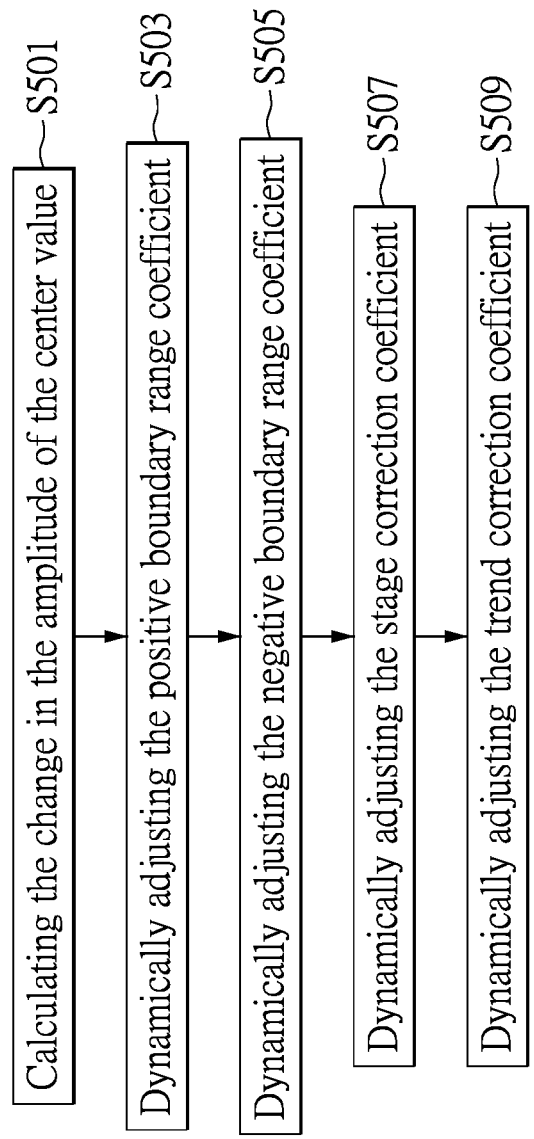
FIG. 5 is a fifth flowchart diagram of steps of the method of stabilizing the data of the digital signals according to the embodiment of the present disclosure.

Reference is made to FIGS. 5 and 6, in which FIG. 5 is a fifth flowchart diagram of steps of the method of stabilizing the data of the digital signals according to the embodiment of the present disclosure, and FIG. 6 is a schematic diagram of a computing architecture of the method of stabilizing the data of the digital signals according to the embodiment of the present disclosure.

As shown in FIG. 5, in the embodiment of the present disclosure, the method of stabilizing the data of the digital signals may include steps S501 to S509 that are applicable to the computing architecture as shown in FIG. 6. It should be understood that, steps S501 to S509 can be optionally performed.

After the multiple pieces of digital input data are sequentially read as described above, step S501 is performed.

In step S501, a change in an amplitude of the above-mentioned center value is calculated.

In step S503, the positive boundary range coefficient is dynamically adjusted according to the change in the amplitude of the center value.

In step S505, the negative boundary range coefficient is dynamically adjusted according to the change in the amplitude of the center value.

In step S507, the stage correction coefficient is dynamically adjusted according to the change in the amplitude of the center value.

In step S509, the trend correction coefficient is dynamically adjusted according to the change in the amplitude of the center value.

Figures 7, 8:
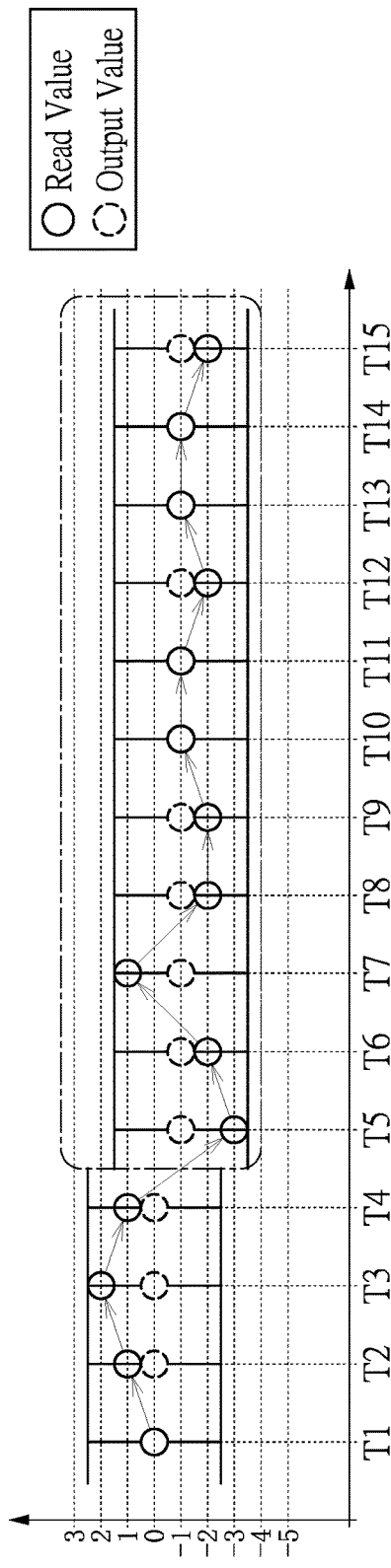
FIG. 7 is a first schematic diagram of values of multiple pieces of digital input data generated when both of a boundary range coefficient and a stage correction coefficient are set to "2" and a trend correction coefficient is set to "0" in the method of stabilizing the data of the digital signals according to the embodiment of the present disclosure.
FIG. 8 is a first schematic diagram of a table list of values of multiple pieces of digital input data generated when both of the boundary range coefficient and the stage correction coefficient are set to "2" and the trend correction coefficient is set to "0" in the method of stabilizing the data of the digital signals according to the embodiment of the present disclosure.

Reference is made to FIGS. 7 and 8, in which FIG. 7 is a first schematic diagram of values of multiple pieces of digital input data generated when both of a boundary range coefficient and a stage correction coefficient are set to "2" and a trend correction coefficient is set to "0" in the method of stabilizing the data of the digital signals according to the embodiment of the present disclosure, and FIG. 8 is a first schematic diagram of a table list of values of multiple pieces of digital input data generated when both of the boundary range coefficient and the stage correction coefficient are set to "2" and the trend correction coefficient is set to "0" in the method of stabilizing the data of the digital signals according to the embodiment of the present disclosure.

In the embodiment of FIGS. 7 and 8, the positive boundary range coefficient is set to "2", the negative boundary range coefficient is set to "−2", the stage correction coefficient is set to "2", and the trend correction coefficient is set to "0".

An output value "+0" at a time point T4 is subtracted from a value "−3" of digital input data read at a time point T5 to calculate a difference "−3". It is determined that the difference "−3" is smaller than the negative boundary range coefficient "−2" in step S217 shown in FIG. 2, and thus step S219 shown in FIG. 2 is performed. In step S219, the value "−3" of the digital input data read at the time point T5 and the stage correction coefficient "2" are summed up to calculate an output value "−1" at the time point T5.

An output value "−1" at a time point T9 is subtracted from a value "−1" of digital input data read at a time point T10 to calculate a difference "0".

If the trend correction coefficient is set to "0", an output value at the time point T10 is equal to the output value "4" at the time point T9 regardless of the base value.

The output value from a time point T5 to a time point T15 maintains at a constant value. It is apparent that a difference exists between the output value and an actual output value.

Figures 9, 10:
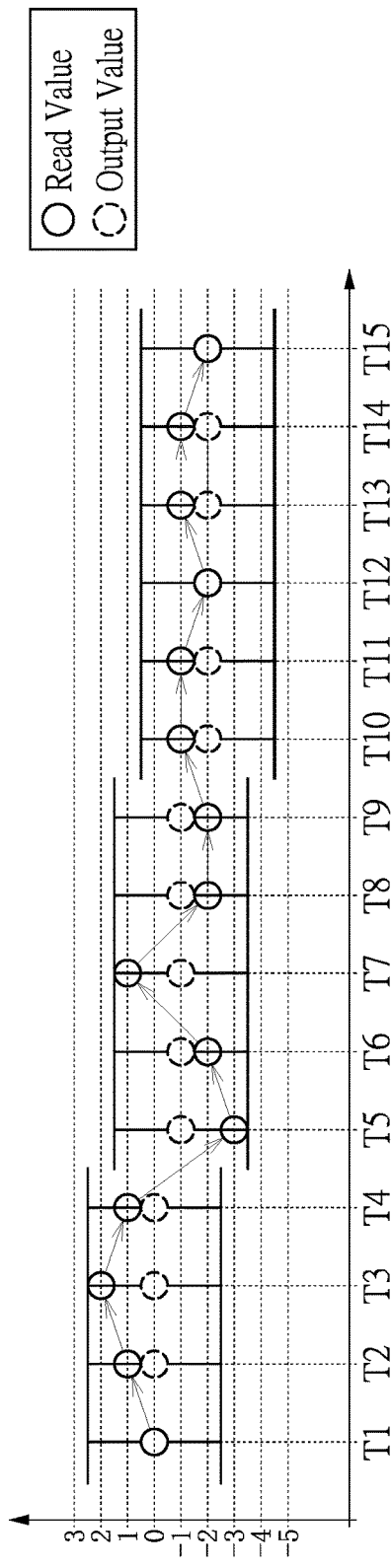
FIG. 9 is a second schematic diagram of values of multiple pieces of digital input data generated when both of the boundary range coefficient and the stage correction coefficient are set to "2" and the trend correction coefficient is set to "1" in the method of stabilizing the data of the digital signals according to the embodiment of the present disclosure.
FIG. 10 is a second schematic diagram of a table list of values of multiple pieces of digital input data generated when both of the boundary range coefficient and the stage correction coefficient are set to "2" and the trend correction coefficient is set to "1" in the method of stabilizing the data of the digital signals according to the embodiment of the present disclosure.

Reference is made to FIGS. 9 and 10, in which FIG. 9 is a second schematic diagram of values of multiple pieces of digital input data generated when both of the boundary range coefficient and the stage correction coefficient are set to "2" and the trend correction coefficient is set to "1" in the method of stabilizing the data of the digital signals according to the embodiment of the present disclosure, and FIG. 10 is a second schematic diagram of a table list of values of multiple pieces of digital input data generated when both of the boundary range coefficient and the stage correction coefficient are set to "2" and the trend correction coefficient is set to "1" in the method of stabilizing the data of the digital signals according to the embodiment of the present disclosure.

In the embodiment of FIGS. 9 and 10, the positive boundary range coefficient is set to "2", the negative boundary range coefficient is set to "−2", the stage correction coefficient is set to "2", and the trend correction coefficient is set to "1".

The output value "−1" at the time point T9 is subtracted from the value "−1" of the digital input data read at the time point T10 to calculate a difference "0". If it is determined that the difference "0" is larger than the positive boundary range coefficient, the trend correction coefficient "1" is subtracted from the output value "−1" at the time point T9 to calculate an output value "−2" at the time point T10.

It is apparent that, if the trend correction coefficient is set and not equal to the zero value, the output value is corrected according to the trend correction coefficient. As a result, the output value stably changes with the trend correction coefficient, and the difference between the output value and the actual output value decreases.

In conclusion, the present disclosure provides the method of stabilizing the data of the digital signals, which has the following characteristics:

1. an algorithm is executed on the digital signals to correct the digital signals according to the preset positive boundary range coefficient, the preset negative boundary range coefficient, the preset stage correction coefficient and the preset trend correction coefficient, thereby reducing noise of the digital signals and improving stability of the output values of the digital signals;
2. the positive boundary range coefficient, the negative boundary range coefficient, the stage correction coefficient and the trend correction coefficient can be manually set according to user's needs or automatically set and adjusted (for example, according to a change in an amplitude of the input value or the output value);
3. the value of the next piece of digital input data can be compared with the output value of the previous piece of digital input data in real time, which only takes a small amount of time, and only a small part of a space of a register is occupied by these digital input data;
4. a digital filter, an averager or other digital processors can be used to perform operations on the digital signals, and
5. the method of the present disclosure can be performed by a digital hardware circuit or a software.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method of stabilizing data of digital signals, comprising the following steps:
    (a) setting a positive boundary range coefficient, a negative boundary range coefficient, a stage correction coefficient and a trend correction coefficient;
    (b) reading a piece of digital input data;
    (c) outputting a value of the piece of digital input data as an output value of the piece of digital input data;
    (d) reading a next piece of digital input data;
    (e) subtracting the output value of the piece of digital input data being previously read from a value of the next piece of digital input data being currently read to calculate a difference;
    (f) determining whether or not the difference is larger than the positive boundary range coefficient, in response to determining that the difference is larger than the positive boundary range coefficient, subtracting the stage correction coefficient from the value of the next piece of digital input data to output an output value of the next piece of digital input data, defining a trend value to be a zero value and then performing step (j), and in response to determining that the difference is not larger than the positive boundary range coefficient, performing step (g);

(g) determining whether or not the difference is smaller than the negative boundary range coefficient, in response to determining that the difference is smaller than the negative boundary range coefficient, summing up the value of the next piece of digital input data and the stage correction coefficient to output the output value of the next piece of digital input data, defining the trend value to be the zero value, performing step (j), and in response to determining that the difference is not smaller than the negative boundary range coefficient, performing step (h);

(h) determining whether or not the value of the next piece of digital input data is larger than the output value of the piece of digital input data being previously read, in response to determining that the value of the next piece of digital input data is larger than the output value of the piece of digital input data being previously read, adding a base value to the trend value and then performing step (j), and in response to determining that the value of the next piece of digital input data is not larger than the output value of the piece of digital input data being previously read, performing step (i);

(i) determining whether or not the value of the next piece of digital input data is smaller than the output value of the piece of digital input data being previously read, in response to determining that the next piece of digital input data is smaller than the output value of the piece of digital input data being previously read, subtracting the base value from the trend value and performing step (j), and in response to determining that the next piece of digital input data is not smaller than the output value of the piece of digital input data being previously read, performing step (j);

(j) determining whether or not the trend value is larger than a positive trend threshold, in response to determining that the trend value is larger than the positive trend threshold, subtracting the trend correction coefficient from the output value of the piece of digital input data being previously read to output the output value of the next piece of digital input data, performing step (d) to read a further next piece of digital input data, and in response to determining that the trend value is not larger than the positive trend threshold, performing step (k);

(k) determining whether or not the trend value is smaller than a negative trend threshold, in response to determining that the trend value is smaller than the negative trend threshold, summing up the output value of the piece of digital input data being previously read and the trend correction coefficient to output the output value of the next piece of digital input data, performing step (d) to read the further next piece of digital input data, and in response to determining that the trend value is not smaller than the negative trend threshold, performing step (l); and (l) outputting a value that is equal to the output value of the piece of digital input data being previously read as the output value of the next piece of digital input data, and then performing step (d) to read the further next piece of digital input data.

2. The method according to claim 1, further comprising the following step:
(m) defining a value of the piece of digital data that is earliest read as a center value.

3. The method according to claim 2, further comprising the following steps:
(n) determining whether or not the difference is larger than the positive boundary range coefficient, in response to determining that the difference is larger than the positive boundary range coefficient, subtracting the stage correction coefficient from the value of the next piece of digital input data to calculate a first center value, updating the center value to be equal to the first center value, outputting a value that is equal to the first center value as the output value of the next piece of digital input data and then performing step (j), and in response to determining that the difference is not larger than the positive boundary range coefficient, performing step (o); and (o) determining whether or not the difference is smaller than the negative boundary range coefficient, in response to determining that the difference is smaller than the negative boundary range coefficient, summing up the value of the next piece of digital input data and the stage correction coefficient to calculate a second center value, updating the center value to be equal to the second center value, outputting a value that is equal to the second center value as the output value of the next piece of digital input data and then performing step (j), and in response to determining that the difference is not smaller than the negative boundary range coefficient, performing step (h).

4. The method according to claim 3, further comprising the following steps:
(p) calculating a change in an amplitude of the center value; and
(q) according to the change in the amplitude of the center value, dynamically adjusting one or more of the positive boundary range coefficient, the negative boundary range coefficient, the stage correction coefficient and the trend correction coefficient.

5. The method according to claim 1, comprising the following step:
(r) setting the positive boundary range coefficient to be equal to an absolute value of the negative boundary range coefficient.

6. The method according to claim 1, further comprising the following step:
(s) setting the trend correction coefficient to be smaller than one or more of the positive boundary range coefficient, the absolute value of the negative boundary range coefficient and the stage correction coefficient.

7. The method according to claim 1, further comprising the following step:
(t) setting the trend correction coefficient such that a ratio of the trend correction coefficient to the positive boundary range coefficient or the negative boundary range coefficient is equal to a preset trend boundary ratio.

8. The method according to claim 1, further comprising the following step:
(u) setting the trend correction coefficient such that a ratio of the trend correction coefficient to the stage correction coefficient is equal to a preset trend stage ratio.

9. The method according to claim 1, further comprising the following step:
(v) setting the trend value to be the zero value before adding the base value to the trend value or subtracting the base value from the trend value.

10. The method according to claim 1, further comprising the following step:

(w) according to a value of each of multiple pieces of digital input data, automatically adjusting the base value such that a ratio of the value of each of the multiple pieces of digital input data to the base value is equal to a preset ratio.

* * * * *